US009601540B2

(12) United States Patent
Takami

(10) Patent No.: US 9,601,540 B2
(45) Date of Patent: Mar. 21, 2017

(54) METHOD FOR PRODUCING SEMICONDUCTOR DEVICE

(71) Applicant: CANON KABUSHIKI KAISHA, Tokyo (JP)

(72) Inventor: Koki Takami, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 14/726,127

(22) Filed: May 29, 2015

(65) Prior Publication Data

US 2015/0349018 A1    Dec. 3, 2015

(30) Foreign Application Priority Data

Jun. 3, 2014 (JP) ................................. 2014-115282

(51) Int. Cl.
*H01L 27/146*  (2006.01)

(52) U.S. Cl.
CPC .. *H01L 27/14685* (2013.01); *H01L 27/14621* (2013.01); *H01L 27/14623* (2013.01); *H01L 27/14625* (2013.01); *H01L 27/14627* (2013.01); *H01L 27/14629* (2013.01); *H01L 27/14643* (2013.01); *H01L 27/14687* (2013.01)

(58) Field of Classification Search
CPC .............................. H01L 31/18; H01L 21/768
See application file for complete search history.

(56) References Cited

U.S. PATENT DOCUMENTS

| 2012/0199928 A1* | 8/2012 | Sawada | ............. | H01L 27/14625 |
| | | | | 257/432 |
| 2015/0036991 A1* | 2/2015 | Lai | .......... | G02B 6/124 |
| | | | | 385/132 |
| 2016/0013325 A1* | 1/2016 | Kitakado | ................ | H01L 29/45 |
| | | | | 257/43 |

FOREIGN PATENT DOCUMENTS

| JP | 2000-156360 A | 6/2000 |
| JP | 2002-026119 A | 1/2002 |
| JP | 2002-158198 A | 5/2002 |
| JP | 2003-017559 A | 1/2003 |
| JP | 2012-182427 A | 9/2012 |
| JP | 2014-036038 A | 2/2014 |

* cited by examiner

*Primary Examiner* — Michael Jung
*Assistant Examiner* — Mikka Liu
(74) *Attorney, Agent, or Firm* — Canon U.S.A. Inc., IP Division

(57) ABSTRACT

A method for producing a semiconductor device includes preparing a wafer having plural portions and having an insulator having plural openings thereon, forming an embedding member in each of the plural openings and on the insulator, removing at least a part of the embedding member, and planarizing the embedding member. The plural portions have a first portion and a second portion and each of the first portion and the second portion has a first region and a second region. The density of the openings in the first region is higher than that in the second region. The process of removing at least a part of the embedding member includes removing the embedding member positioned in the second region of the first portion, and removing the embedding member positioned in the second region of the second portion. A first removal amount and a second removal amount in the processes are different.

20 Claims, 11 Drawing Sheets

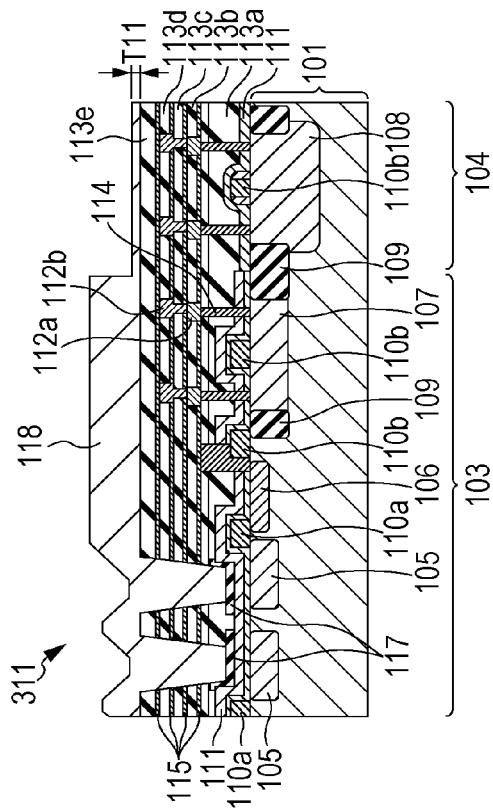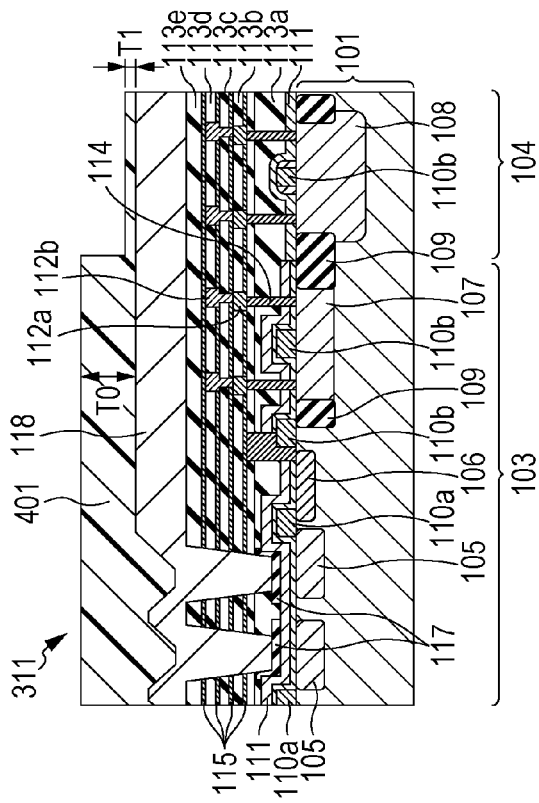
FIG. 4A1
FIG. 4A2

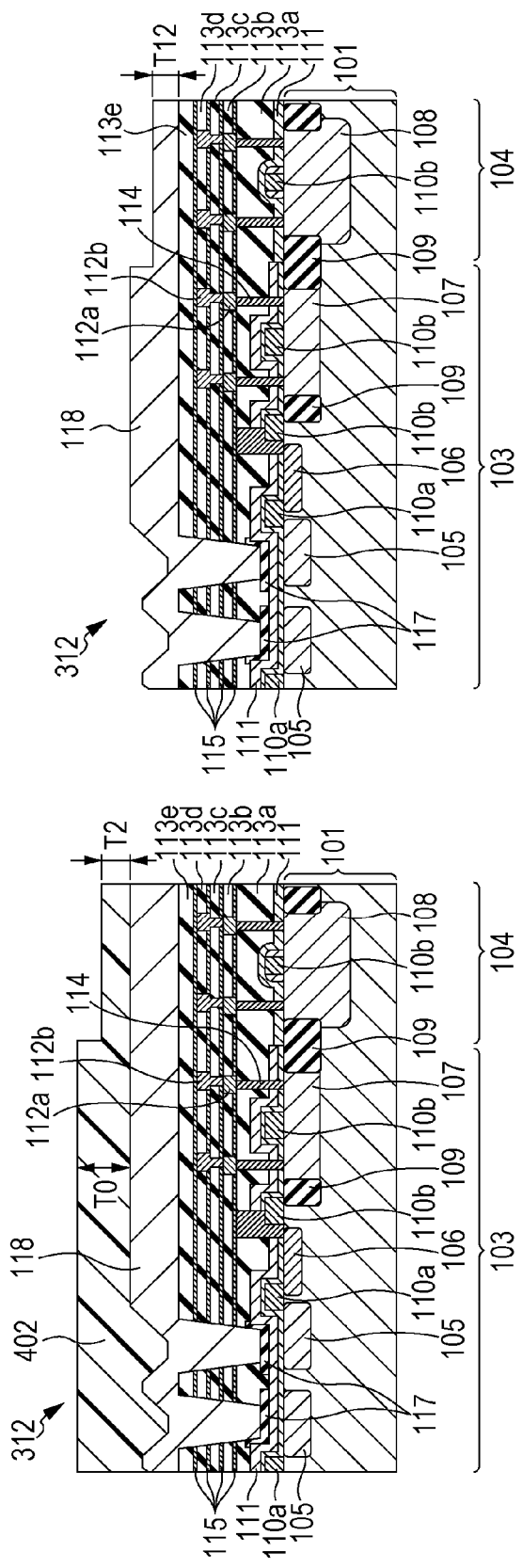

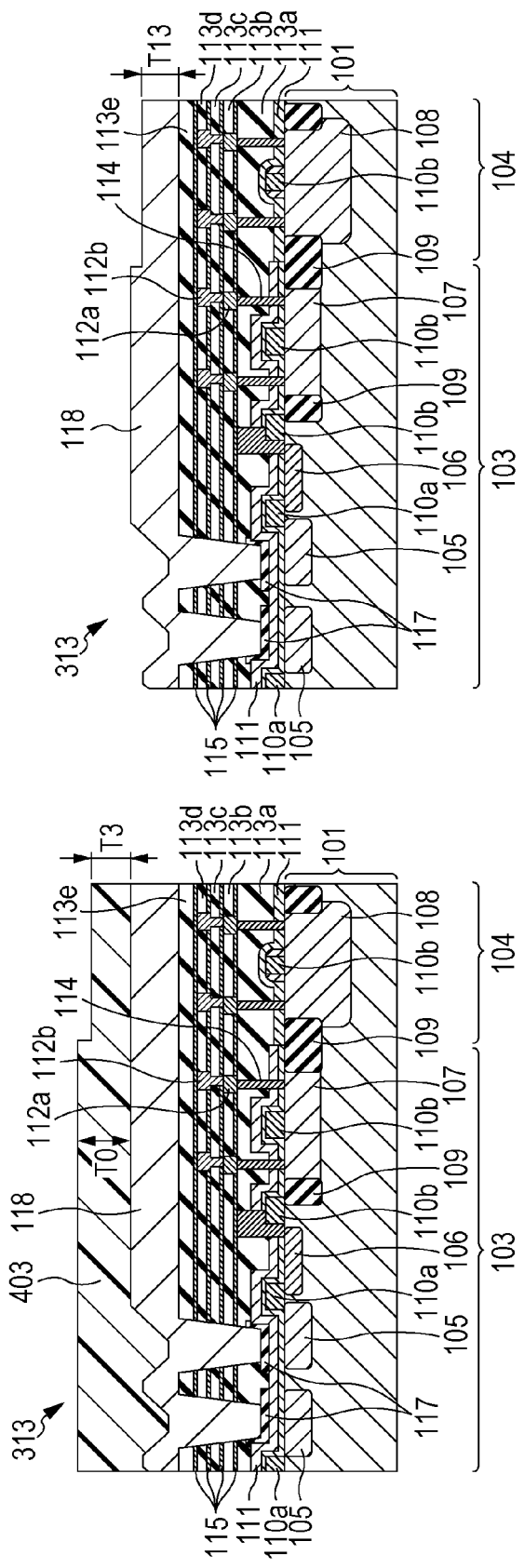

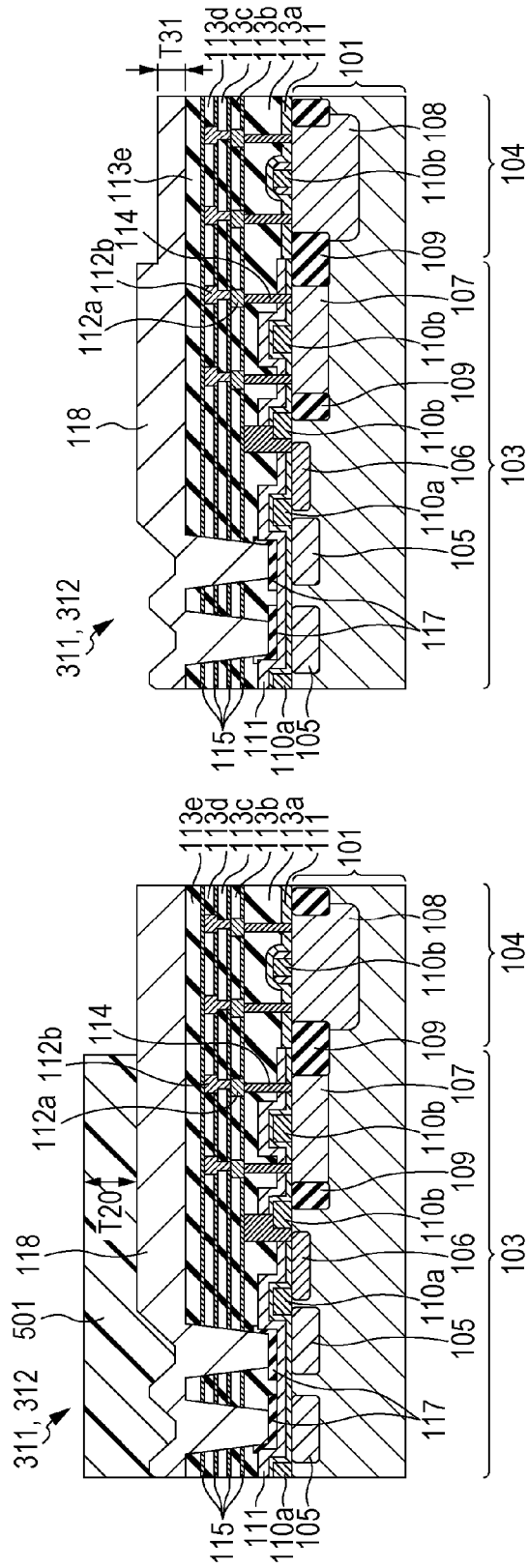

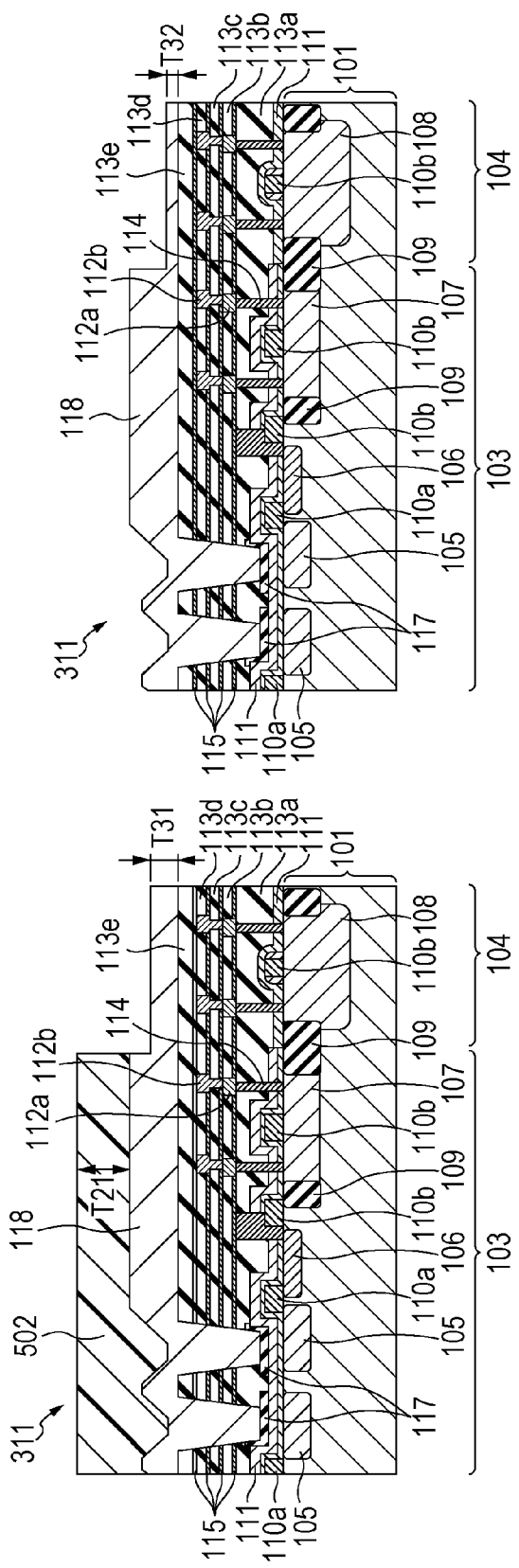

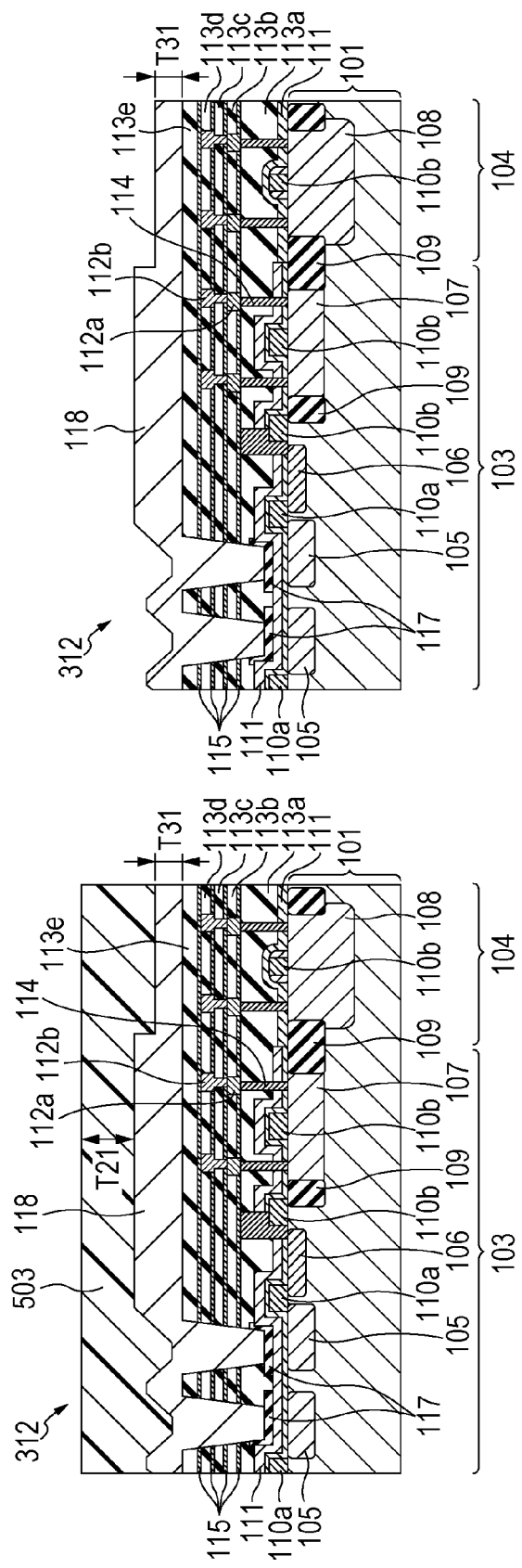

METHOD FOR PRODUCING SEMICONDUCTOR DEVICE

BACKGROUND

Field of the Invention

The present technique relates to a method for producing a semiconductor device.

Description of the Related Art

In recent years, in a solid state image pickup device which is one of semiconductor devices, a solid state image pickup device provided with a waveguide has been proposed. Japanese Patent Laid-Open No. 2012-182427 discloses a method for increasing the flatness when forming a waveguide. The method includes forming an embedding member in openings of an insulator for forming the waveguide, removing the embedding member disposed in a peripheral region, and then performing planarization processing.

When the planarization processing is performed according to the method described in Japanese Patent Laid-Open No. 2012-182427, the flatness of one solid state image pickup device improves, but, in a portion equivalent to another solid state image pickup device to be simultaneously formed in the plane of a semiconductor wafer, the film thickness of the embedding member may be different. Also in a semiconductor device which is not a solid state image pickup device, when the semiconductor device has a structure in which an embedding member is formed in openings and planarization processing is performed, the same variation may arise. Thus, the present technique aims at providing a method for producing a semiconductor device capable of further planarizing the inside of the plane of a wafer.

SUMMARY

One of methods for producing a semiconductor device of the present disclosure has a process of preparing a wafer having a plurality of portions each of which serves as a semiconductor device and having an insulator having a plurality of openings on the plurality of respective portions, a process of forming an embedding member in each of the plurality of openings and on the insulator, a process of removing at least a part of the embedding member formed on the insulator, and, after the process of removing at least a part of the embedding member, planarizing the embedding member, in which the plurality of portions have a first portion and a second portion positioned at the outer side of the wafer than the first portion, each of the first portion and the second portion has a first region and a second region at a position different from the position of the first region, the plurality of openings are disposed in the first region with a density higher than the density in the second region in each of the first portion and the second portion, and the process of removing at least a part of the embedding member has a process of removing the embedding member positioned in the second region of the first portion and a process of removing the embedding member positioned in the second region of the second portion, in which a first removal amount in the process of removing the embedding member positioned in the second region of the first portion and a second removal amount in the process of removing the embedding member positioned in the second region of the second portion are different from each other.

Further features of the present invention will become apparent from the following description of exemplary embodiments with reference to the attached drawings.

BRIEF DESCRIPTION OF THE DRAWINGS

FIGS. 4A1 to 4C2 are schematic cross-sectional views for explaining the method for producing a solid state image pickup device of EXAMPLE 1.

FIGS. 5A1 to 5C2 are schematic cross-sectional views for explaining a method for producing a solid state image pickup device of EXAMPLE 2.

DESCRIPTION OF THE EMBODIMENTS

Figure 1A:
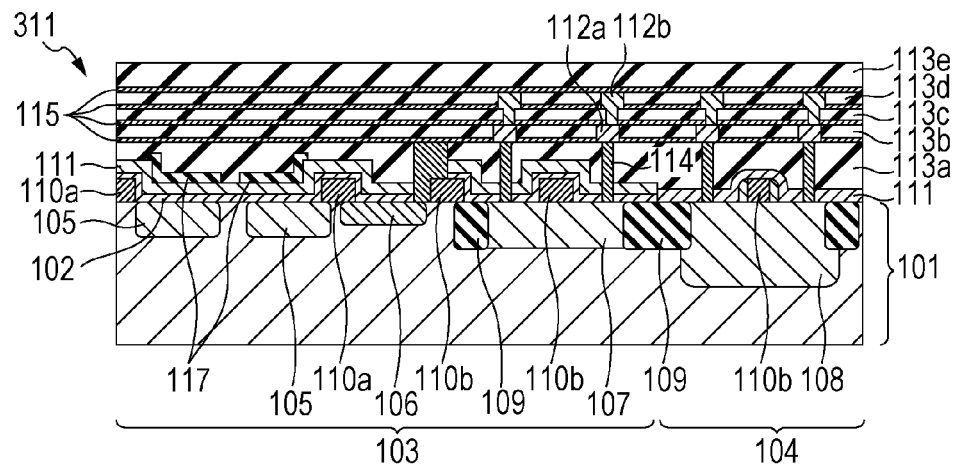
FIGS. 1A to 1C are schematic cross-sectional views for explaining a method for producing a solid state image pickup device of EXAMPLE 1.

The present disclosure relates to a method for producing a semiconductor device and relates to a production method when forming a plurality of semiconductor devices on a semiconductor wafer. The present technique achieves an improvement of the flatness in the plane of the wafer after planarization processing. The production method of the present technique is suitable as a method for producing a solid state image pickup device, for example. Hereinafter, a method for producing a solid state image pickup device is described as Examples of the present technique.

Example 1

A production method of this example is described with reference to FIGS. 1A to 1C to FIGS. 4A1 to 4C2. First, a wafer 300 is described with reference to FIG. 3A. FIG. 3A is a schematic plane view for explaining the wafer 300 and a portion 304 serving as a solid state image pickup device. Herein, the schematic plane view is a drawing when each configuration is viewed in plane and is an orthogonal projection view of each configuration. The wafer 300 has a circle shape having a center 305 and has a notch 303, the outer edge of which is partially dented toward the center 305. The wafer 300 is a semiconductor wafer, for example, a silicon wafer, and is also referred to as a semiconductor substrate or a silicon substrate. The wafer 300 has an effective region 301 serving as a solid state image pickup device and an invalid region 302 which does not serve as a solid state image pickup device. The effective region 301 is provided with a plurality of portions 304 each serving as one solid state image pickup device, i.e., one chip. The one chip is obtained by dicing the wafer 300 to divide the wafer 300 into individual pieces.

The plurality of portions 304 are two-dimensionally disposed on the wafer 300. A detailed description is given focusing on portions 311 to 313 provided at arbitrary positions among the plurality of portions 304. The portion 311 is positioned closest to the center 305 among the portions 311 to 313. The portion 313 is positioned furthest from the center 305 among the portions 311 to 313 and is positioned near the outer edge. The portion 312 is positioned between the portion 311 and the portion 313 and is positioned distant from the center 305 relative to the portion 311. A direction toward the outer edge from the center 305 is defined as a direction toward the outer side.

Figure 3A:
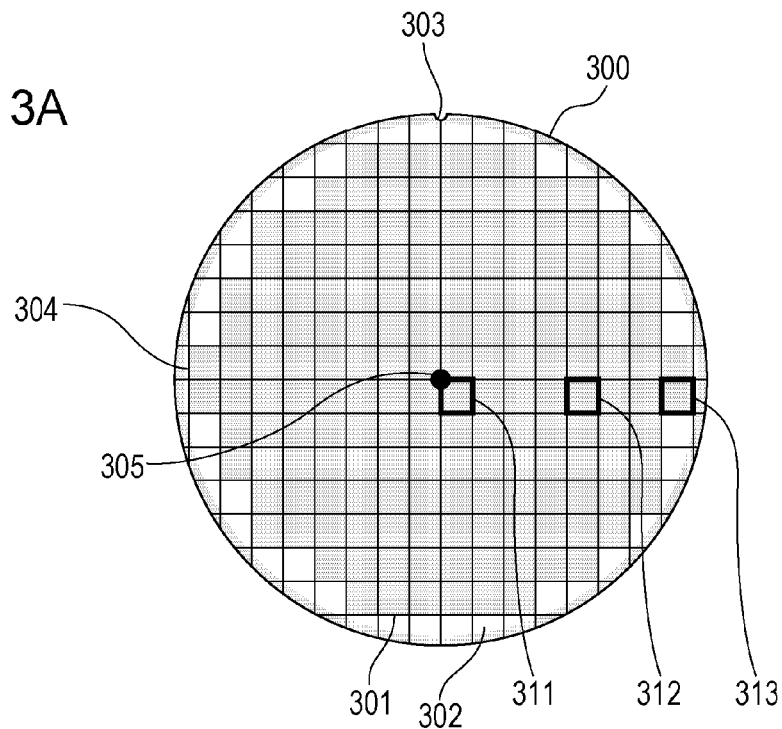
FIGS. 3A and 3B are schematic plane views for explaining the method for producing a solid state image pickup device of EXAMPLE 1.
Figure 3B:
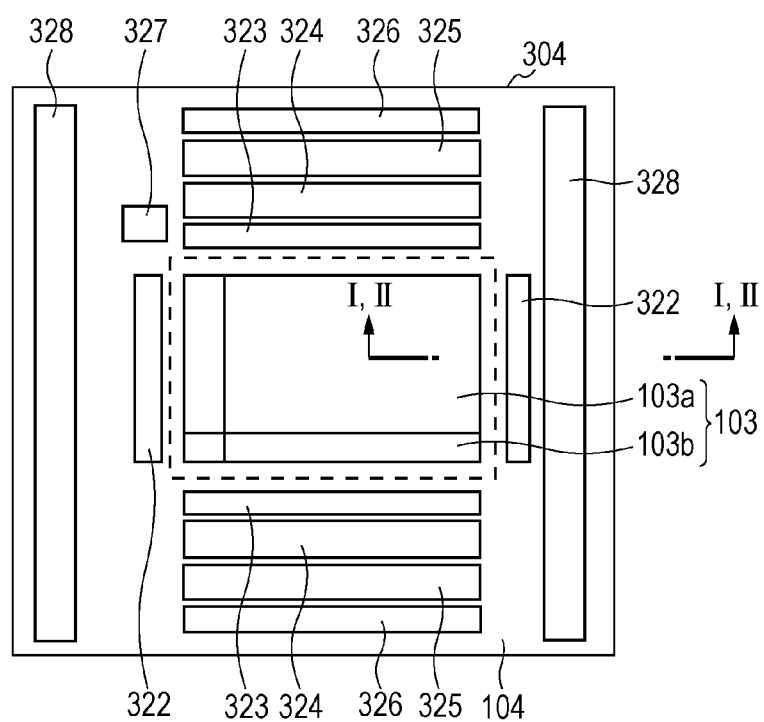

The configuration of each portion is described with reference to FIG. 3B. FIG. 3B is a schematic plane view of one portion 304 and more specifically a schematic view showing the planar structure of the solid state image pickup device. In FIG. 3B, the portion 304 has an image pickup region 103 (first region) and a peripheral region 104 (second region). The image pickup region 103 may include a light receiving region 103a and a light-shielded region 103b. A plurality of pixels are two-dimensionally disposed in the image pickup region 103. A pixel disposed in the light-shielded region 103b is a so-called optical black pixel in which a photoelectric conversion element is shielded from light. In this example, although the light-shielded region 103b is included in the image pickup region 103, the peripheral region 104 may include the light-shielded region 103b. The peripheral region 104 is a region other than the image pickup region 103. In this example, vertical scanning circuits 322, horizontal scanning circuits 323, column amplifier circuits 324, column AD conversion circuits 325, memories 326, a timing generator 327, and pad portions 328 are disposed in the peripheral region 104. These circuits are signal-processing circuits for processing signals from the pixels. Some of the circuits may not be disposed and other circuits may be provided.

Next, the production method of this example is described with reference to FIGS. 1A to 1C and FIGS. 2A to 2C. FIGS. 1A to 1C and FIGS. 2A to 2C are schematic cross-sectional views of the portion 311 in each process of the production method and are schematic cross-sectional views taken along the straight line I, II-I, II shown in FIG. 3B. Herein, a description is given focusing on the portion 311 among the plurality of portions 304. In the description below, a detailed description of the configuration which can be formed by a general semiconductor process is omitted.

A process of preparing a wafer having an insulator is described with reference to FIG. 1A. First, a semiconductor substrate 101 which is a wafer having an insulator formed on a principal surface 102 is prepared. In the semiconductor substrate 101, the plurality of portions 304 including the portion 311 are arranged, and each portion has the image pickup region 103 and the peripheral region 104. The principal surface 102 of the semiconductor substrate 101 is the interface between the semiconductor substrate 101 and the insulator in a region in which elements are to be formed. This insulator is a thermal oxidation film or the like disposed in contact with the semiconductor substrate 101 on the semiconductor substrate 101, for example.

In the semiconductor substrate 101, a plurality of semiconductor regions configuring a plurality of elements are provided. The image pickup region 103 is provided with photoelectric conversion elements 105, a floating diffusion (hereinafter referred to as FD) 106, a pixel transistor, and a well 107. The pixel transistor includes an amplification transistor and a reset transistor. The photoelectric conversion element 105 is a photodiode, for example, and shows an N-type semiconductor region which functions as a charge accumulation region. The FD 106 is an N-type semiconductor region. In this example, the FD 106 is electrically connected to a gate electrode 110b of the amplification transistor through a plug 114 but may be electrically connected to a signal output line. In the well 107, source/drain regions of the amplification transistor which amplifies a signal, the reset transistor which resets an input node of the amplification transistor, and the like are provided (not illustrated). The peripheral region 104 is provided with a well 108. The well 108 is provided with a source/drain region of a peripheral transistor configuring a signal-processing circuit. Herein, the semiconductor substrate 101 is provided with element isolation portions 109. The element isolation portion 109 is an insulator containing a silicon oxide film formed by an STI method or the like.

On the semiconductor substrate 101, gate electrodes 110a and 110b are provided. The gate electrodes 110a and 110b are disposed on the principal surface 102 of the semiconductor substrate 101 through an insulating film, such as a silicon oxide film (not illustrated). The gate electrode 110a controls transmission of charges between the photoelectric conversion element 105 and the FD 106. The gate electrodes 110b are gates of a pixel transistor and a peripheral transistor.

The insulator provided on the semiconductor substrate 101 at least has a plurality of interlayer insulation films. In FIG. 1A, the insulator includes a protective layer 111, etching stop members 117, a plurality of interlayer insulation films 113a to 113e, and a plurality of diffusion preventing films 115 provided on the principal surface 102 of the semiconductor substrate 101. The insulator may have a wiring structure thereinside. The wiring structure includes a first wiring layer 112a, a second wiring layer 112b, a plug 114 electrically connected thereto, and the like, for example. The interlayer insulation films are provided in order to insulate the plurality of wiring layers, the semiconductor substrate, and the like from each other. The protective layer 111 is a silicon nitride film and may be configured from a plurality of layers including a silicon nitride film and a silicon oxide film. The protective layer 111 may have a function of reducing damages which may be given to the photoelectric conversion element in a post process, a reflection prevention function, and a function of preventing diffusion of metal in a silicide process. The etching stop member 117 is a silicon nitride film, for example, and the area is desired to be larger than the area of the bottom face of an opening 116 to be formed later. The protective layer 111 and the etching stop member 117 are not necessarily need to be formed. The first wiring layer 112a and the second wiring layer 112b are formed by a damascene process (dual damascene process) and contain a conductor containing copper as the main component. The plug 114 contains a conductor containing tungsten as the main component, for example. For convenience, the interlayer insulation films 113a to 113e are silicon oxide films, for example, and are designated as first to fifth interlayer insulation films 113a to 113e in order from the one closer to the semiconductor substrate 101. The plurality of diffusion preventing films 115 are provided between the first to fifth interlayer insulation films 113a to 113e, and contain, for example, a silicon nitride film. The plurality of diffusion preventing films 115 have a function as an etching stop film, a function as a diffusion preventing film of a conductor (metal) configuring a wiring layer, or both the functions.

Figure 1B:
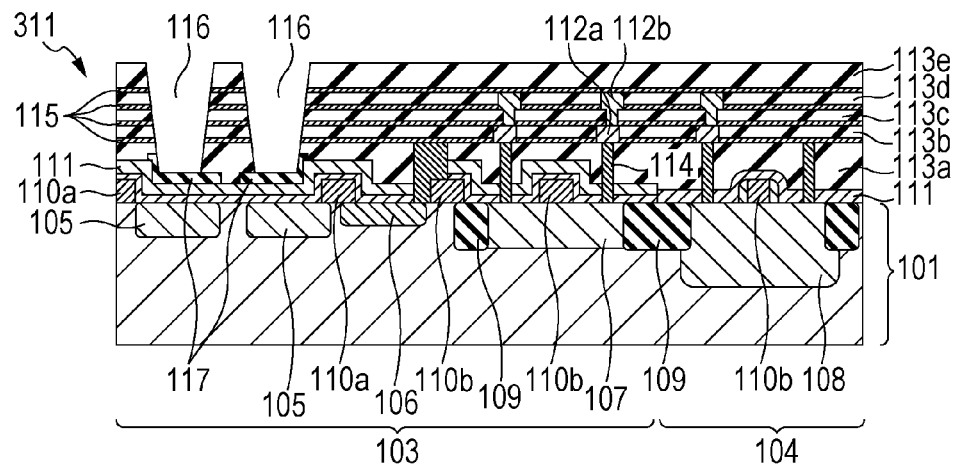

A process of forming openings in the insulator is described with reference to FIG. 1B. A plurality of openings 116 are formed in the insulator. A photoresist pattern (not illustrated) having openings in portions where the openings 116 are to be formed is formed on the fifth interlayer insulation film 113e of FIG. 1A. Then, dry etching is performed using the photoresist pattern as a mask to remove portions corresponding to the openings of the photoresist pattern of the insulator, whereby the openings are formed. The openings 116 may penetrate the insulator and the insulator may partially remain on the bottom face. In FIG. 1B, the openings 116 expose the etching stop members 117. The planar shape of the openings 116 is a circular shape or a rectangular shape and may be a shape like a groove extending over the plurality of photoelectric conversion elements 105.

Herein, the planar arrangement of the openings 116 is described. The plurality of openings 116 are formed at the positions each overlapped with each of the plurality of photoelectric conversion elements 105 of the insulator. In this example, the arrangement density of the openings 116 is higher in the image pickup region 103 than in the peripheral region 104. The density of the openings 116 is determined based on the ratio (area occupancy) of the area occupied by the openings 116 in a unit area as viewed in plane. In this example, a large number of openings 116 are disposed in the image pickup region 103 and the opening 116 is not formed in the peripheral region 104. However, the opening 116 may be disposed in the peripheral region 104.

Next, a process of forming the embedding member on the entire wafer is described with reference to FIG. 1C. The embedding member is formed in the openings of each portion and on the insulator in which the openings are formed. On the insulator in which the openings are formed, a first embedding member 118 which is a member configuring a waveguide is formed. The first embedding member 118 is formed over the image pickup region 103 and the peripheral region 104 in such a manner as to embed the inside of the openings 116. At this time, the first embedding member 118 is formed not only in the openings but on the insulator. The inside of the openings does not need to be thoroughly embedded with the embedding member and a void may remain in a part of the inside of the openings.

Herein, before forming the first embedding member 118, a liner film (not illustrated) may be formed. More specifically, the process of forming the embedding member may have a plurality of processes of a process of forming a first film and a process of forming a second film on the first film. First, before forming the first embedding member 118, a liner film (not illustrated) is formed as the first film on the side surface of the openings 116 and the fifth interlayer insulation film 113e. Then, the first embedding member 118 is formed with a larger film thickness on the liner film. The formation of the liner film and the first embedding member 118 can be achieved by the film formation by a high-density plasma CVD method, a parallel plate plasma CVD method, or sputtering or the application of an organic material typified by a polyimide polymer. The first embedding member 118 may be formed by a plurality of methods. For example, in the first process, a part of the first embedding member 118 may be formed under the conditions where the adhesiveness with the liner film becomes high, and, in the following process, a remaining part of the first embedding member 118 may be formed under the conditions that the embedding properties of the inside of the openings 116 become high. Or, the first embedding member 118 may be formed by successively forming a plurality of different materials. For example, the first embedding member 118 may be formed by first depositing a silicon nitride film, and then depositing an organic material with high embedding performance.

Then, a process of removing at least a part of the embedding member formed on the insulator is described with reference to FIG. 2A. In a plurality of portions of the first embedding member 118, at least a part of the first embedding member 118 formed on the insulator is removed. Specifically, a part of the embedding member refers to a portion provided in the peripheral region 104 of the first embedding member 118. For the removal method, dry etching in which a resist pattern (not illustrated) formed on the first embedding member 118 is used as a mask, lift-off, and the like can be used.

A part to be removed of the first embedding member 118 is described from the viewpoint as viewed in plane and the viewpoint as viewed in the depth direction. As viewed in plane, a part of the embedding member refers to at least a part of the portion disposed on the insulator of the peripheral region 104 of the first embedding member 118. At least a part of the embedding member may be removed and it is suitable to remove a large part of the portion of the first embedding member 118 disposed on the insulator of the peripheral region 104. The entire surface of the portion of the first embedding member 118 disposed in the peripheral region 104 may be removed. Then, a part in the depth direction refers to at least a part in the thickness direction of the first embedding member 118. More specifically, the thickness of the first embedding member 118 disposed in the peripheral region 104 may be smaller than the thickness immediately after forming the first embedding member 118. At least a part of the embedding member may be the entire portion thereof but it is suitable that the first embedding member 118 is present in such a manner that the insulator is not exposed. Herein, this example has a feature that a part to be removed of the first embedding member 118 has a distribution in the plane of the wafer. This feature is described in detail later.

Next, a process of planarizing the embedding member is described with reference to FIG. 2B. The first embedding member 118 which is partially removed as shown in FIG. 2A is subjected to planarization processing, such as a CMP method, mechanical polishing, or etching. In this example, the planarization is performed by a CMP method. Herein, since the film thickness of the first embedding member 118 is different as shown in FIG. 2A, it becomes possible to reduce a polishing variation in the planarization processing by a CMP method.

Next, the remaining process is described with reference to FIG. 2C. As shown in FIG. 2C, on the upper surface of the first embedding member 118 subjected to the planarization processing, a sixth interlayer insulation film 119, a third wiring layer 112c, and intralayer lenses 120 are formed in this order. The sixth interlayer insulation film 119 is suitably formed with the same material as that of the fifth interlayer insulation film 113e. In this example, the sixth interlayer insulation film 119 is a silicon oxide film. Next, a through-hole for connection with a predetermined conductive member of the second wiring layer 112b is formed penetrating the sixth interlayer insulation film 119 and the first embedding member 118, and then a plug 121 containing a conductor is formed. Next, a third wiring layer 112c to be connected to the plug 121 is formed. In this example, a conductive member of the third wiring layer 112c is formed with aluminum. A layer covering the top of the third wiring layer 112c and having the intralayer lenses 120 is formed. The intralayer lenses 120 are disposed corresponding to the photoelectric conversion elements 105. The intralayer lens 120 is formed with a silicon nitride film, for example. As a method for forming the intralayer lens 120, well-known methods can be used. Then, a color filter, a micro lens, and the like are formed on the intralayer lens 120 as necessary, and then the wafer 300 is diced, whereby a solid state image pickup device is completed.

Herein, a process of removing at least a part of the embedding member formed on the insulator is described in detail with reference to FIGS. 4A1 to 4C2. FIGS. 4A1, 4B1, and 4C1 are schematic cross-sectional views showing a process of forming the resist pattern for removing at least a part of the first embedding member 118 in the portions 311 to 313, respectively. Then, FIGS. 4A2, 4B2, and 4C2 are schematic cross-sectional views showing the state after performing the process of removing at least a part of the first embedding member 118 from the state of FIGS. 4A1, 4B1, and 4C1. Since FIGS. 1A to 1C and FIGS. 2A to 2C show the portion 311 in each process, FIG. 4A2 is the same drawing as FIG. 2A.

Figure 1C:
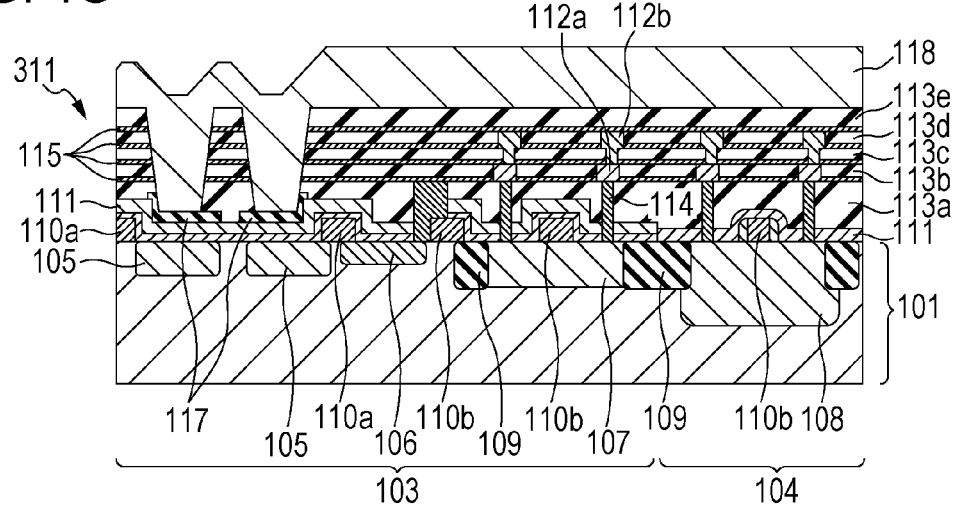

FIGS. 4A1, 4B1, and 4C1 show the state where processes of forming resist patterns 401 to 403, respectively, were performed after the process of FIG. 1C. The resist pattern 401 is formed in the portion 311, the resist pattern 402 is formed in the portion 312, and the resist pattern 403 is formed in the portion 313. The resist patterns 401 to 403 basically have a film thickness T0. However, each of the resist patterns 401 to 403 in the peripheral region 104 of the respective portions has a film thickness T1, a film thickness T2, and a film thickness T3, respectively. The relationship of the film thickness in this example is Film thickness T1<Film thickness T2<Film thickness T3<Film thickness T0. By performing dry etching using the resist pattern as a mask, for example, the resist pattern and the first embedding member 118 are removed. And then, by removing the remaining resist pattern, the configurations of FIGS. 4A2, 4B2, and 4C2 are obtained.

Figure 2A:
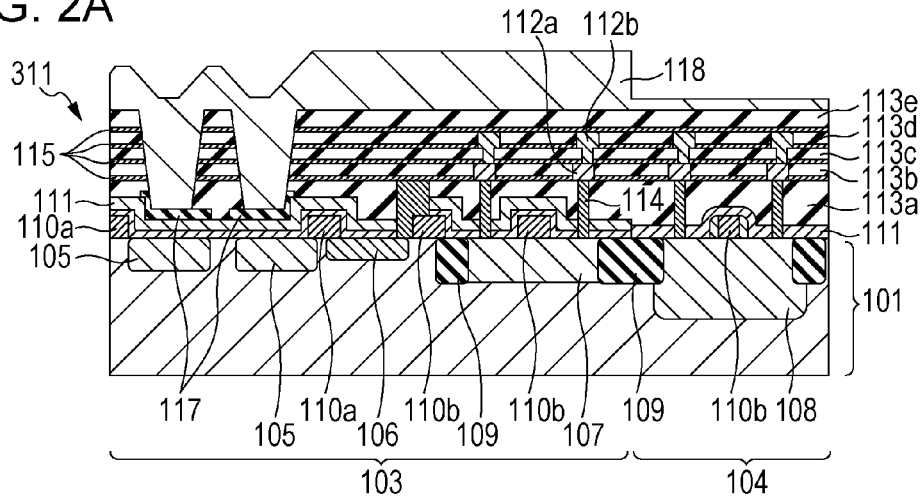
FIGS. 2A to 2C are schematic cross-sectional views for explaining the method for producing a solid state image pickup device of EXAMPLE 1.
Figure 2B:
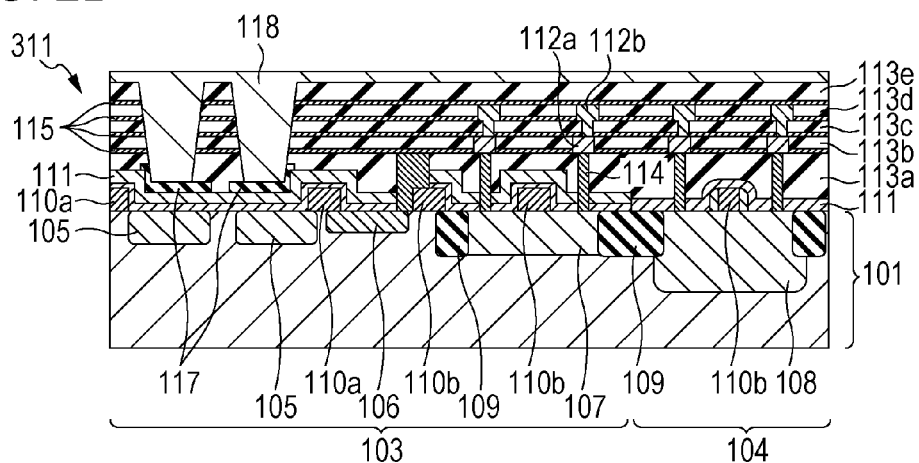
Figure 2C:
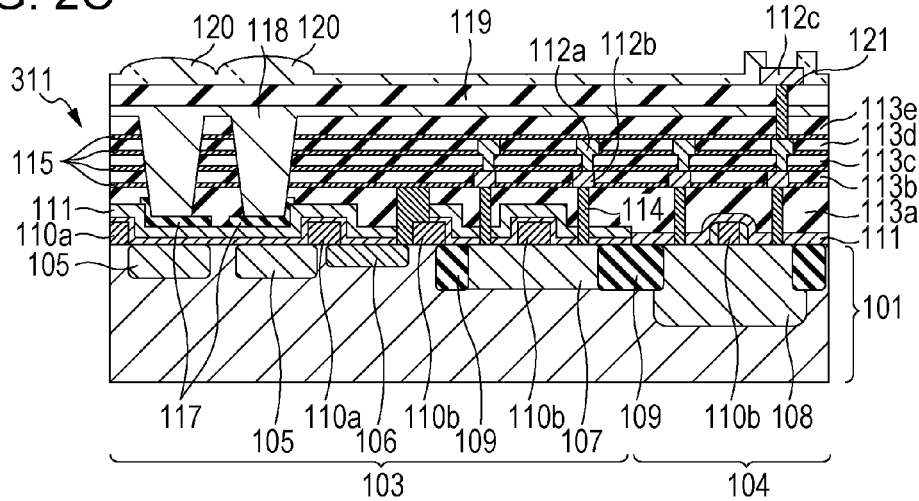

FIG. 4A2 is a drawing showing the same state as the state of FIG. 2A. In FIGS. 4A2, 4B2, and 4C2, the film thickness of the first embedding member 118 in the image pickup region 103 is an initial film thickness T10 (not illustrated) when the member was formed. However, the first embedding member 118 in the peripheral region 104 has a film thickness T11, a film thickness T12, and a film thickness T13 in FIGS. 4A2, 4B2, and 4C2, respectively. The relationship of the film thickness in this example is Film thickness T11<Film thickness T12<Film thickness T13<Film thickness T10. Due to having such a process, it becomes possible to increase the flatness in the entire wafer in the process of planarizing the embedding member performed later.

The relationship of the film thickness is determined in such a manner as to be canceled by a distribution of a variation in the processing speed of the planarization processing in the next process of planarizing the embedding member. For example, when the processing speed in the next planarizing process is high on the outer side of the wafer, the film thickness T13 of the resist pattern 403 formed in the portion 313 is made large. Then, a process of removing a part of the first embedding member 118 is performed in such a manner that the first embedding member 118 has the film thickness T13, i.e., a larger part thereof remains on the outer side of the wafer. When the processing speed is high in the inner side of the wafer, the relationship of the film thickness may be reversed. In the case of a CMP method, the processing speed can be adjusted by the pressure of the pads, a polishing material to be used, and the like, and the processing speed can also be adjusted as appropriate by the other methods.

Herein, a method for forming a resist pattern different in film thickness is mentioned as a method for changing the removal amount of the first embedding member 118. When forming the resist pattern different in film thickness, a method for forming separately resist patterns, a method for forming a resist pattern different in thickness by adjusting the exposure amount by area coverage modulation using a photoresist film or using a gradation mask of a gray tone or the like, and then developing, and the like are mentioned. As a method for changing the removal amount of the first embedding member 118, a method for changing the number of times of performing the process of removing a part of the first embedding member 118 is also mentioned. These methods are not limited, and when the process of removing a part of the first embedding member 118 ends, the removal amount may be different depending on positions of the wafer. Herein, the removal amount is a difference between the height before performing the processing in the film thickness direction and the height after performing the processing. For example, the difference may be determined at one position in the second region of a certain portion or the differences at a plurality of positions in the second region of a certain portion may be determined and then equalized.

The planarization processing by the production method described above is described. In the case where there are two regions different in the density of the openings 116 as in the image pickup region 103 and the peripheral region 104, when the first embedding member 118 is formed in such a manner as to embed the openings, a large difference in the level arises between the region having a high density of the openings 116 and the region having a low density of the openings 116. Therefore, in former techniques, the difference in the level between the image pickup region 103 and the peripheral region 104 was reduced to some extent by removing a part of a portion disposed in the peripheral region 104 of the first embedding member 118 before the process of performing the planarization processing. However, there has been a possibility that a film thickness distribution of the first embedding member may have remained in the plane of the wafer in each of the removal process and the planarization processing process of the first embedding member. In the present technique, in the removal process of the first embedding member, the removal amount of the first embedding member of the region of each portion is varied according to the position of the portion in the wafer in such a manner as to reflect the polishing profile of the wafer level produced in the planarization processing process. Thus, better flatness can be obtained in the process of performing the planarization processing.

Example 2

EXAMPLE 2 of the method for producing a solid state image pickup device according to the present disclosure is described. The production method of this example is different from EXAMPLE 1 in that the process of removing at least a part of the embedding member formed on the insulator has two removal processes. This example is described with reference to FIGS. 5A1 to 5C2. FIGS. 5A1 to 5C2 are schematic cross-sectional views showing the portion 311 and the portion 312. In this example, the same configurations as those of EXAMPLE 1 are denoted by the same reference numerals and a detailed description thereof is omitted.

A first removal process is described with reference to FIG. 5A1. FIG. 5A1 shows a process of forming a resist pattern 501 after the process of FIG. 1C of EXAMPLE 1. Herein, the resist pattern 501 is provided on the first embedding member 118 of the portion 311 and the portion 312. The resist pattern 501 has a thickness of a film thickness T20 in the image pickup region 103 and has an opening in the peripheral region 104 in both the portion 311 and the portion 312. By removing a part of the first embedding member 118 by etching or the like using the resist pattern 501 as a mask, and then separating the resist pattern 501, the configuration of FIG. 5A2 is obtained. As shown in FIG. 5A2, the portion 311 and the portion 312 have the first embedding member 118 having a film thickness T31 in the peripheral region 104.

Next, a second removal process is performed. In the second removal process, a photoresist pattern is formed again on the first embedding member 118 of FIG. 5A2, and then removal is performed. First, a resist pattern 502 shown in FIG. 5B1 is formed in the portion 311 and a resist pattern 503 shown in FIG. 5C1 is formed in the portion 312. The resist pattern 502 has a thickness of a film thickness T21 in the image pickup region 103 and has an opening in the peripheral region 104. The resist pattern 503 has a thickness of the film thickness T21 in the image pickup region 103 and also has a thickness of the film thickness T21 in the peripheral region 104. By removing a part of the first embedding member 118 by etching or the like using such resist patterns 502 and 503 as a mask, and then separating the resist patterns 502 and 503, the configurations of FIG. 5B2 and FIG. 5C2 are obtained. As shown in FIG. 5B2, the portion 311 has the first embedding member 118 having a film thickness T32 in the peripheral region 104. As shown in FIG. 5C2, the portion 312 has the first embedding member 118 having a film thickness T31 in the peripheral region 104. Herein, Film thickness T32<Film thickness T31 is established. By performing the process of planarizing the first embedding member 118 as shown in FIG. 2B after such a process, a flatter upper surface can be obtained.

Example 3

EXAMPLE 3 of the method for producing a solid state image pickup device according to the present disclosure is described. The production method of this example is different from EXAMPLE 1 in that the process of forming an embedding member and the process of removing at least a part of the first embedding member 118 are performed two or more times. This example is described with reference to FIGS. 6A to 6C and FIG. 7. FIGS. 6A to 6C and FIG. 7 are schematic cross-sectional views showing the portion 311. In this example, the same configurations as those of EXAMPLE 1 are denoted by the same reference numerals and a detailed description thereof is omitted. Moreover, in this example, a description of the same processes as those of the other examples is omitted.

Figure 6A:
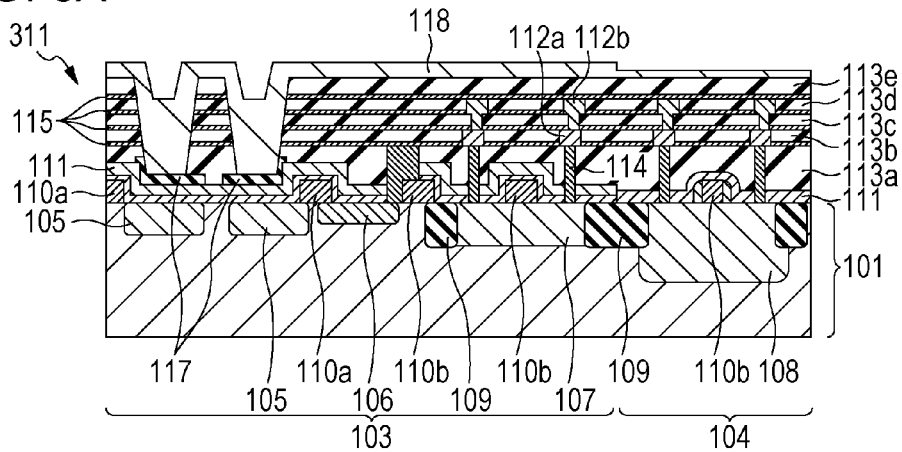
FIGS. 6A to 6C are schematic cross-sectional views for explaining a method for producing a solid state image pickup device of EXAMPLE 3.

FIG. 6A is a schematic cross-sectional view of the portion 311 after subjected to the same process as the process of FIG. 2A. More specifically, FIG. 6A shows a state after the process of forming the liner film and the first embedding member 118, and then removing a part of the first embedding member 118 disposed in the peripheral region 104. Herein, the removal amount in each portion shown in FIG. 3A is varied.

Figure 6B:
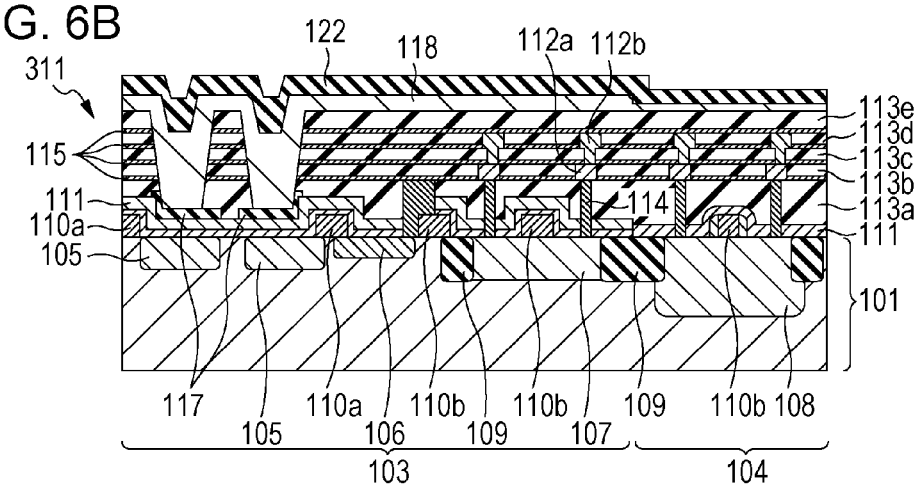

Next, as shown in FIG. 6B, a second embedding member 122 configuring a waveguide is formed over the image pickup region 103 and the peripheral region 104. The second embedding member 122 may contain the same material as that of the first embedding member 118 or may contain a different material. In this example, the first embedding member 118 and the second embedding member 122 contain silicon nitride formed by the plasma CVD method as the material. Herein, the second embedding member 122 positioned in the peripheral region 104 may be removed and the removal amount in each portion in that case may be varied.

Figure 6C:
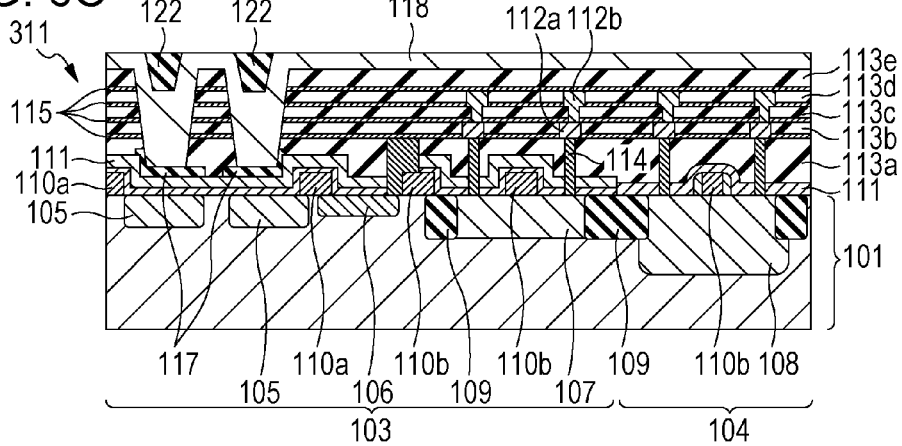

Then, as shown in FIG. 6C, a process of planarizing the second embedding member 122 and the first embedding member 118 is performed. In FIG. 6C, the second embedding member 122 is not present in the peripheral region 104 and the second embedding member 122 is present in the image pickup region 103. However, the second embedding member 122 may be provided in the peripheral region 104, the second embedding member 122 may not be present in the image pickup region 103, or both the structures may be simultaneously employed.

Figure 7:
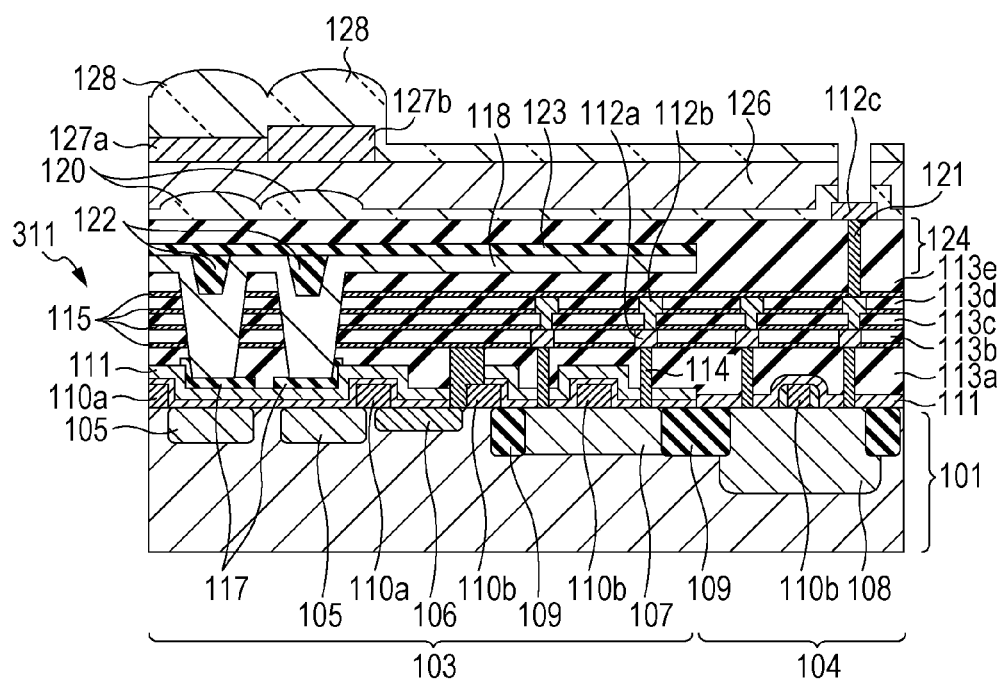
FIG. 7 is a schematic cross-sectional view for explaining the method for producing a solid state image pickup device of EXAMPLE 3.

Thereafter, a configuration shown in FIG. 7 is formed. First, a low refractive index member 123 is formed on the first and second embedding members. The low refractive index member 123 is formed by a silicon oxynitride film and has a refractive index lower than the refractive index of the first embedding member 118 and the second embedding member 122. The low refractive index member 123 does not necessarily need to be provided. Then, the first embedding member 118 and the low refractive index member 123 formed in the peripheral region 104 are removed. When the second embedding member 122 is present in the peripheral region 104, the second embedding member 122 is removed. In particular, in this process, the first embedding member 118 and the like disposed at the position where the plug 121 described later is to be disposed and disposed in a region within a predetermined distance from the position where the plug 121 is to be disposed are removed. This process can facilitate etching for forming a through-hole for forming a plug later. In the process of removing a part of the embedding member, this process may be performed. As a removal method, well-known methods, such as etching, can be used. Then, a seventh interlayer insulation film 124 is formed. The seventh interlayer insulation film 124 is suitably formed with the same material as the material of the fifth interlayer insulation film 113e. The upper surface of the seventh interlayer insulation film 124 may be planarized as necessary. Thereafter, the plug 121, the third wiring layer 112c, and the intralayer lenses 120 are formed. On the intralayer lenses 120, a planarized layer 126, color filters 127a and 127b, and micro lenses 128 are formed. The planarized layer 126 is formed with an organic material, for example. The color filters 127a and 127b are disposed corresponding to the photoelectric conversion elements 105.

Also in such a production method, it is possible to provide a solid state image pickup device having better flatness by changing the removal amount in each portion.

The present technique is not limited to the production method of Examples described above. Each example can be altered and combined as appropriate. For example, the process of FIG. 5B of EXAMPLE 2 can also be applied to the production method of EXAMPLE 1 and may be applied to the other examples. Although the description above is given taking a solid state image pickup device as an example of the semiconductor device of the present disclosure, another semiconductor device may be acceptable. Furthermore, one formed by the opening and the embedding member of the present technique is not limited to a waveguide and the present invention can also be applied to the case of forming a through electrode and an element isolation portion, insofar as the process of embedding a member in the opening is provided.

According to the present technique, a method for producing a semiconductor device in which the inside of the plane of a wafer can be further planarized can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-115282, filed Jun. 3, 2014, which is hereby incorporated by reference herein in its entirety.

What is claimed is:

1. A method for producing a semiconductor device comprising:
   preparing a wafer having a plurality of portions each of which serves as a semiconductor device and having an insulator having a plurality of openings on the plurality of respective portions;
   forming an embedding member in each of the plurality of openings and on the insulator;
   partly removing the embedding member formed on the insulator; and
   after the partly removing of the embedding member, planarizing the embedding member,
   wherein
   the plurality of portions have a first portion and a second portion positioned at an outer side of the wafer than the first portion,
   the first portion has a first region and a second region at a position different from a position of the first region, and the second portion has a third region and a fourth region at a position different from a position of the third region,
   the plurality of openings in the first portion are disposed in the first region with a density higher than a density in the second region, and the plurality of openings in the second portion are disposed in the third region with a density higher than a density in the fourth region, and
   the partly removing of the embedding member includes:
   a first removal process in which a part of the embedding member positioned in the second region and a part of the embedding member positioned in the fourth region are removed by etching using a first resist pattern as a mask; and
   a second removal process in which at least a part of the embedding member positioned in the second region is removed by etching using a second resist pattern as a mask while a third resist pattern is positioned on at least a part of the embedding member positioned in the fourth region,
   wherein a first removal amount in the partly removing of the embedding member positioned in the second region and a second removal amount in the partly removing of the embedding member positioned in the fourth region are different from each other.

2. The method for producing a semiconductor device according to claim 1, wherein the insulator includes a plurality of interlayer insulation films for insulating a plurality of wiring layers from each other and each of the plurality of openings penetrates at least one interlayer insulation film of the plurality of interlayer insulation films.

3. The method for producing a semiconductor device according to claim 1, wherein the first removal amount is greater than the second removal amount.

4. The method for producing a semiconductor device according to claim 3, wherein in the second removal process, the embedding member positioned in the second region is removed by a third removal amount corresponding to a difference between the first removal amount and the second removal amount.

5. The method for producing a semiconductor device according to claim 3, wherein in the first removal process, the embedding member positioned in the second region is removed by a removal amount corresponding to the second removal amount.

6. The method for producing a semiconductor device according to claim 1, wherein, in the partly removing of the embedding member,
   a part of the embedding member is removed so that the insulator is not exposed.

7. The method for producing a semiconductor device according to claim 1, wherein the second region and the fourth region are not provided with the plurality of openings.

8. The method for producing a semiconductor device according to claim 1, wherein the second resist pattern has an opening that exposes the embedded member.

9. The method for producing a semiconductor device according to claim 1, wherein the part of the embedding member positioned in the second region and removed in the second removal process is positioned between the insulator and the part of the embedding member positioned in the second region and removed in the first removal process.

10. The method for producing a semiconductor device according to claim 1, further comprising dicing the wafer to divide the wafer into semiconductor devices, wherein one of the semiconductor devices includes the first portion, and another one of the semiconductor devices includes the second portion.

11. The method for producing a semiconductor device according to claim 10, wherein, in the preparation of the wafer,
   a plurality of photoelectric conversion elements are provided in the first region,
   a circuit for processing signals from the photoelectric conversion elements is provided in the second region, and
   the plurality of openings are provided corresponding to the plurality of photoelectric conversion elements, and
   wherein, in the formation of the embedding member, the embedding member contains silicon nitride and configures an optical waveguide with the plurality of interlayer insulation films.

12. The method for producing a semiconductor device according to claim 1, further comprising forming another embedding member in the plurality of openings between the partly removing and the planarizing.

13. A method for producing a semiconductor device comprising:
   preparing a wafer having a plurality of portions each of which serves as a semiconductor device and having an insulator having a plurality of openings on the plurality of respective portions;
   forming an embedding member in each of the plurality of openings and on the insulator;
   partly removing the embedding member formed on the insulator; and
   after the partly removing of the embedding member, planarizing the embedding member,
   wherein the plurality of portions have a first portion and a second portion positioned at an outer side of the wafer than the first portion,
   the first portion has a first region and a second region at a position different from a position of the first region, and the second portion has a third region and a fourth region at a position different from a position of the third region,
   the plurality of openings in the first portion are disposed in the first region with a density higher than a density in the second region, and the plurality of openings in the second portion are disposed in the third region with a density higher than a density in the fourth region, and wherein the partly removing of the embedding member includes:

forming a first resist pattern having a first thickness on the second region and having a thickness larger than the first thickness on the first region, and a second resist pattern having a second thickness on the fourth region and having a thickness larger than the second thickness on the third region, the second thickness being greater than the first thickness; and removing at least a part of the embedding member positioned in the second region under the first resist pattern, and a part of the embedding member positioned in the fourth region under the second resist pattern, and wherein a first removal amount in the removal of the embedding member positioned in the second region and a second removal amount in the removal of the embedding member positioned in the fourth region are different from each other.

14. The method for producing a semiconductor device according to claim 13, wherein the insulator includes a plurality of interlayer insulation films for insulating a plurality of wiring layers from each other and each of the plurality of openings penetrates at least one interlayer insulation film of the plurality of interlayer insulation films.

15. The method for producing a semiconductor device according to claim 13, wherein, in the removal of the part of the embedding member, the part of the embedding member is removed in such a manner that insulator is not exposed.

16. The method for producing a semiconductor device according to claim 13, wherein the partly removing of the embedding member includes:

forming a photoresist film on the embedding member;

exposing the photoresist film; and forming the first resist pattern and the second resist pattern from the photoresist film through developing of the photoresist film.

17. The method for producing a semiconductor device according to claim 13, wherein the second region and the fourth region are not provided with the plurality of openings.

18. The method for producing a semiconductor device according to claim 13, further comprises dicing the wafer to divide the wafer into semiconductor devices, wherein one of the semiconductor devices includes the first portion, and another one of the semiconductor devices includes the second portion.

19. The method for producing a semiconductor device according to claim 18, wherein, in the preparation of the wafer, a plurality of photoelectric conversion elements are provided in the first region, a circuit for processing signals from the photoelectric conversion elements is provided in the second region, and the plurality of openings are provided corresponding to the plurality of photoelectric conversion elements, and in the formation of the embedding member, the embedding member contains silicon nitride and configures an optical waveguide with the plurality of interlayer insulation films.

20. The method for producing a semiconductor device according to claim 13, further comprising forming another embedding member in the plurality of openings between the partly removing and the planarizing.

* * * * *